(12) United States Patent
Watanabe

(10) Patent No.: US 7,002,835 B2
(45) Date of Patent: Feb. 21, 2006

(54) MEMORY CELL AND SEMICONDUCTOR MEMORY DEVICE

(75) Inventor: Kenya Watanabe, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/890,248

(22) Filed: Jul. 14, 2004

(65) Prior Publication Data
US 2005/0047191 A1 Mar. 3, 2005

(30) Foreign Application Priority Data
Jul. 14, 2003 (JP) ............................. 2003-196303

(51) Int. Cl.
*G11C 11/22* (2006.01)
(52) U.S. Cl. .................... 365/145; 365/117; 365/63; 365/65; 365/109
(58) Field of Classification Search ................ 365/145, 365/117, 63, 65, 109
See application file for complete search history.

(56) References Cited

U.S. PATENT DOCUMENTS 5,430,671 A * 7/1995 Hirano et al. ............... 365/145
6,433,377 B1 * 8/2002 Ohno ......................... 257/295
6,473,330 B1 * 10/2002 Ogiwara et al. ............. 365/145
6,549,448 B1 * 4/2003 Kang ........................ 365/145
6,671,200 B1 * 12/2003 Ogiwara et al. ............. 365/145
6,700,146 B1 * 3/2004 Ito ............................ 257/295
6,826,712 B1 * 11/2004 Ono ............................ 714/6
6,836,428 B1 * 12/2004 Nakura et al. .............. 365/154
6,888,735 B1 * 5/2005 Nishihara ................... 365/145
6,903,959 B1 * 6/2005 Roehr et al. ................ 365/145

FOREIGN PATENT DOCUMENTS

JP  A 5-13774      1/1993
JP  02002298573   * 10/2002

* cited by examiner

*Primary Examiner*—Viet Q. Nguyen
(74) *Attorney, Agent, or Firm*—Oliff & Berridge, PLC

(57) ABSTRACT

Aspects of the invention can prevent delay in output timing of inverted data for each of ferroelectric capacitors, there can be provided NMOSs that can electrically connect upper electrodes of the ferroelectric capacitor with a plate line and electrically connect lower electrodes of the ferroelectric capacitor with bit lines. Further there can be provided NMOSs that can electrically connect the lower electrodes of the ferroelectric capacitor with the plate line, and electrically connect the upper electrodes of the ferroelectric capacitor with bit lines.

7 Claims, 4 Drawing Sheets

MEMORY CELL AND SEMICONDUCTOR MEMORY DEVICE

BACKGROUND OF THE INVENTION

1. Field of Invention

The invention relates to memory cells having ferroelectric capacitors as capacitors for retaining data, and semiconductor memory devices using the memory cells.

2. Description of Related Art

Memories of this type can include those in which one of electrodes of a ferroelectric capacitor is fixed to a voltage, and the other of the electrodes is electrically connectable to a plate line or a bit line. See, for example, Japanese Laid-open Patent Application HEI 5-13774.

SUMMARY OF THE INVENTION

In an image memory that is composed of memory cells of this kind arranged in an array configuration for holding color data of a monochrome image, normally, when any of the pixels that compose the monochrome image are black, data "1" are held at those of the memory cells corresponding to the pixels, and when they are white, data "0" are held at those of the memory cells corresponding to the pixels. For this reason, when an inverted image of the monochrome image in which its black sections and white sections are inverted is to be displayed on a display device or the like, color data read out from the ferroelectric capacitor need to be inverted by a logical circuit, such as an inverter. As a result, there is a problem in that, due to the inversion operation at the logical circuit, the output timing of the inverted image becomes delayed.

An aspect of the invention is to provide memory cells that can prevent delay in output timing of inverted data, and semiconductor memory devices using the memory cells.

To solve the aforementioned problem, an exemplary memory cell in accordance with the invention can include a ferroelectric capacitor, a first connection device that is capable of realizing a first state in which a first electrode of the ferroelectric capacitor is electrically connected to a plate line and a second electrode of the ferroelectric capacitor is electrically connected to a bit line, and a second connection device that is capable of realizing a second state in which the second electrode of the ferroelectric capacitor is electrically connected to the plate line and the first electrode of the ferroelectric capacitor is electrically connected to the bit line. The first state, the second state or a state in which the first electrode and the second electrode are not connected to either the plate line or the bit line can be selected.

Accordingly, with the exemplary memory cell of the invention, the first state in which the first electrode of the ferroelectric capacitor is electrically connected to a plate line and the second electrode is electrically connected to a bit line, the second state in which the second electrode of the ferroelectric capacitor is electrically connected to the plate line and the first electrode of the ferroelectric capacitor is electrically connected to the bit line, or the state in which the first electrode and the second electrode are not connected to either the plate line or the bit line can be selected. Consequently, for instance, when an image memory for holding color data of a monochrome image is formed by arranging the memory cells in an array configuration, and an inverted image of the monochrome image in which black sections and white sections are inverted is to be displayed on a display device or the like, the following can be achieved. When the first state has been selected in holding color data at the ferroelectric capacitor, the second state can be selected, and when the second state has been selected, the first state can be selected, whereby inverted data of the color data held at the ferroelectric capacitor can be directly read out, such that delay in the output timing of the inverted data can be prevented.

Also, in the exemplary memory cell in accordance with the invention, the first connection device may electrically connect a first bit line to the second electrode of the ferroelectric capacitor, and the second connection device may electrically connect a second bit line different from the first bit line to the first electrode of the ferroelectric capacitor. By so doing, for instance, when an image memory is formed by arranging the memory cells in an array configuration, and when, among the ferroelectric capacitors that can be electrically connected with the same bit line, specified ones of the ferroelectric capacitors are connected with the relevant bit line, others of the ferroelectric capacitors can be connected with a bit line different from the relevant bit line, whereby those ferroelectric capacitors can be simultaneously accessed.

Also, in the exemplary memory cell in accordance with the invention, the first connection device may electrically connect a specified bit line to the second electrode of the ferroelectric capacitor, and the second connection device may electrically connect the specified bit line to the first electrode of the ferroelectric capacitor. Consequently, a peripheral circuit or the like for selecting bit lines does not have to be provided, and the chip area can be reduced.

Further, the exemplary memory cell in accordance with the invention may be equipped with a selection device for alternately selecting the first state and the second state at each reading when repeatedly reading the same data from the same ferroelectric capacitor. By so doing, for instance, when an image memory is formed by arranging the memory cells in an array configuration, and when the image memory is serially accessed, and the same data is repeatedly read from the same ferroelectric capacitors, re-writing causes polarization reversal in the entire ferroelectric capacitors, the frequency of polarization reversal can thus be almost equalized in the entire ferroelectric capacitors, the degree of degradation in the entire ferroelectric capacitors can be made to be uniform, and changes in the characteristic by the degradation can be made to be uniform in the entire ferroelectric capacitors.

Also, an exemplary semiconductor memory device in accordance with the invention can include a plurality of the memory cells as described above in an array configuration. Consequently, since the semiconductor memory device in accordance with the invention is formed by arranging the memory cells in an array configuration, when using it as an image memory for holding color data of a monochrome image, and displaying on a display device or the like an inverted image of the monochrome image in which black sections and white sections are inverted, the following can be achieved. By connecting plate lines to electrodes that have been connected to bit lines in holding color data in ferroelectric capacitors, and connecting the bit lines to electrodes that have been connected to the plate lines, inverted data of the color data held at the ferroelectric capacitors can be directly read out, such that delay in the output timing of the inverted data can be prevented.

Also, in the exemplary semiconductor memory device in accordance with the invention, among memory cell groups composed of the plurality of the memory cells that are arranged in the same row, pairs of adjoining ones of the memory cell groups may commonly share a plate line. By so doing, the number of plate lines can be reduced, the placement area for the plate lines can be reduced, and the chip area can be reduced.

Further, in the exemplary semiconductor memory device in accordance with the invention, among memory cell groups composed of the plurality of the memory cells that are arranged in the same row, pairs of adjoining ones of the memory cell groups can be individually provided with plate lines, respectively. By so doing, only ones of the connection devices among the adjoining memory cell groups are connected with those plate lines, and the wiring load of the plate lines by parasitic capacitance of those connection devices can be reduced to about half, and the writing speed and reading speed can be improved.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

An exemplary embodiment in which an image memory for holding color data of a monochrome image is composed by arranging memory cells in accordance with the invention in an array configuration will be described with reference to the accompanying drawings. It is noted that, in the descriptions below, when any pixels that compose the monochrome image are black, data "1" are held in memory cells $5_{nm}$ and $6_{nm}$ corresponding to the pixels concerned, and when they are white, data "0" are held in the memory cells $5_{nm}$ and $6_{nm}$ corresponding to the pixels concerned.

Figure 1:
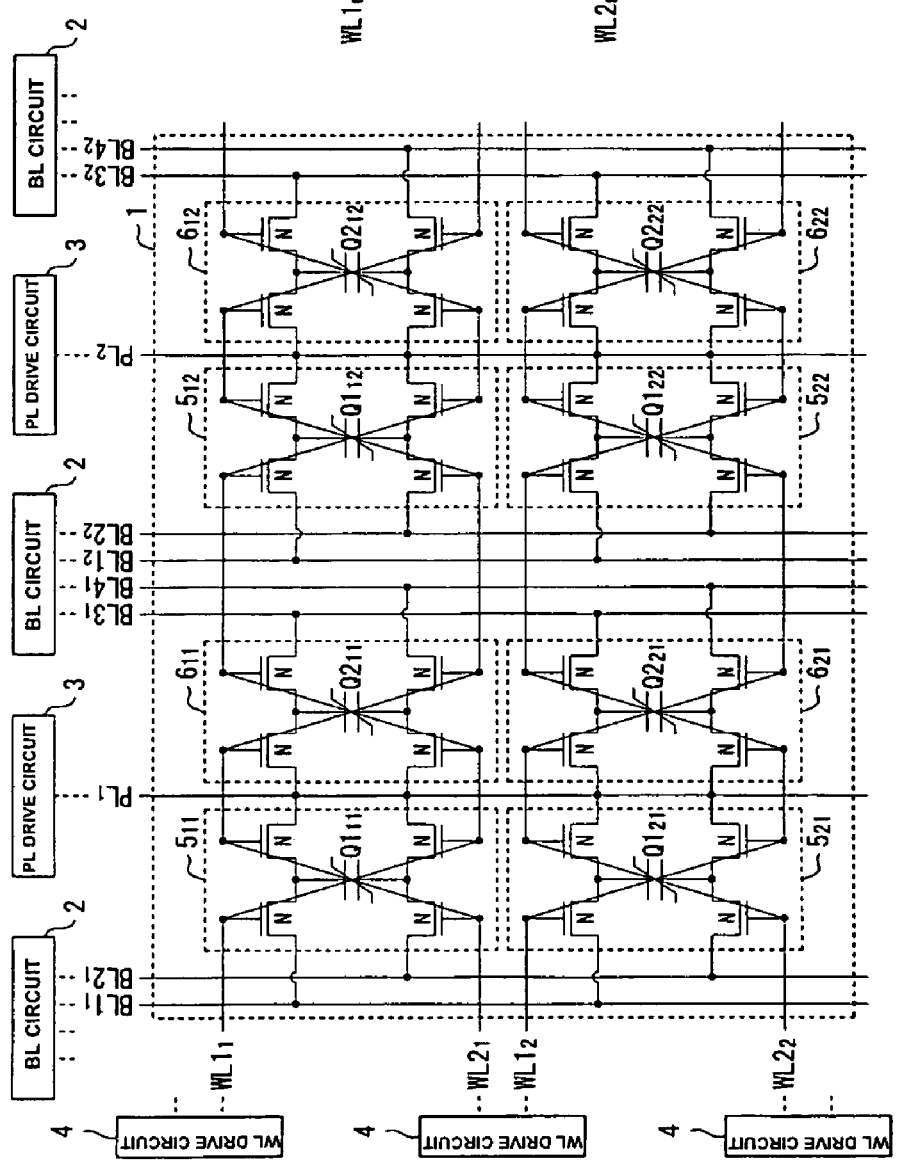
FIG. 1 shows a diagram of the structure of memory cells in accordance with a first exemplary embodiment of the invention.
Figure 1:
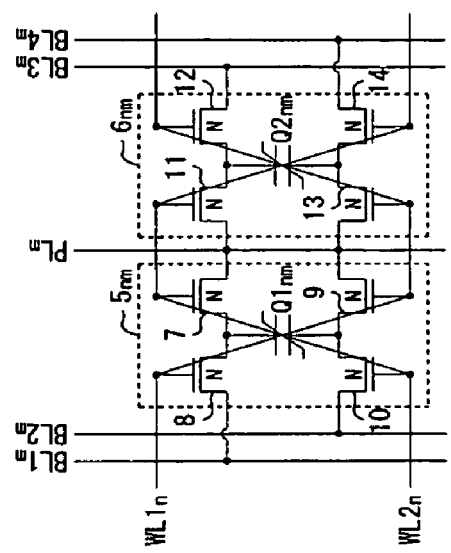

FIG. 1 is a schematic structure diagram of an exemplary semiconductor memory device using memory cells in accordance with the invention. In the figure, each of the circuit blocks and each of the circuit elements are formed on a single semiconductor substrate, such as a single crystal silicon, by a known technology for manufacturing a semiconductor integrated circuit.

In the semiconductor memory device, as shown in FIG. 1(a), a memory array region 1 is formed in its center, and plural bit line (hereafter called BL) circuits 2 including bit line drive circuits and sense amplifiers, and plural plate line (hereafter called PL) drive circuits 3 are alternately disposed along an upper side of the memory array region 1 in a plan view. On the left side in the plan view, plural word line (hereafter called WL) drive circuits 4 are arranged. The bit line circuits 2, the plate line drive circuits 3 and the word line drive circuits 4 drive specified bit lines $BL1_m$, $BL2_m$, plate lines $PL_m$ and word lines $WL1_n$, $WL2_n$ according to control commands from a control circuit not shown.

In the memory array region 1, plural memory cells $5_{nm}$ and $6_{nm}$ (n=1, 2, m=1 through 4) are formed. Two kinds of memory cells $5_{nm}$ and $6_{nm}$ are alternately formed in each horizontal row (hereafter called a part) that is composed of these memory cells $5_{nm}$ and $6_{nm}$, and the same kind of memory cells $5_{nm}$ or $6_{nm}$ are formed in each vertical row (hereafter called a block).

Figure 2:
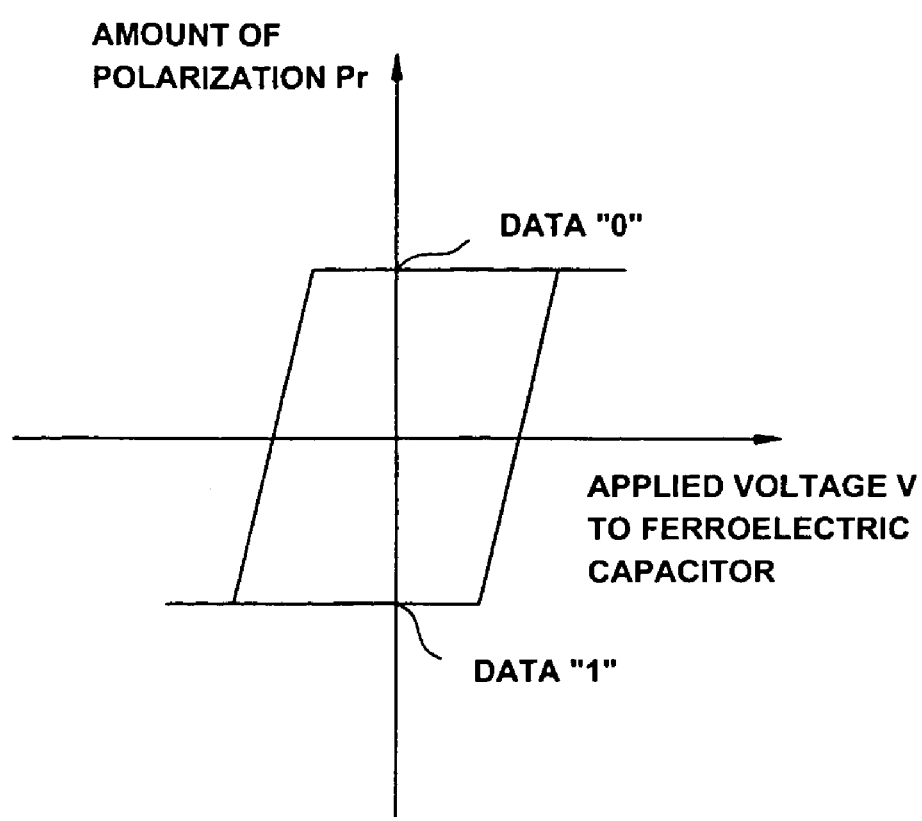
FIG. 2 shows a diagram for describing the characteristic of a ferroelectric capacitor in FIG. 1.

As schematically shown in FIG. 1(b), in a prescribed memory cell $5_{nm}$ (the first memory cell) among these two kinds of memory cells $5_{nm}$ and $6_{nm}$, a ferroelectric capacitor $Q1_{nm}$ is formed at its center, two bit lines $BL1_m$ and $BL2_m$, that extend in the vertical direction from the bit line circuit 2, are arranged on the left side in the plan view of the ferroelectric capacitor $Q1_{nm}$, a plate line $PL_m$, that extends in the vertical direction from the plate line drive circuit 3, is arranged on the right side in the plan view, and two word lines $WL1_n$ and $WL2_n$, that extend in the horizontal direction from the word line drive circuit 4, are arranged on the upper and lower sides in the plan view. As shown in FIG. 2, the direction of voltage applied to the ferroelectric capacitor $Q1_{nm}$ is assumed to be a forward direction when the upper electrodes are at a higher potential than that of the lower electrodes, and conversely, a negative direction when the lower electrodes are at a higher potential than that of the upper electrodes. Also, the direction of voltage applied to the ferroelectric capacitor $Q2_{nm}$ is assumed to be the same as the above.

Also, one of electrodes (hereafter called an upper electrode) of the ferroelectric capacitor $Q1_{nm}$ is connected to one end of an N-channel MOS transistor 7 (hereafter called an NMOS) defining as a switch whose gate is connected to the word line $WL2_n$ and other end is connected to the plate line $PL_m$, and to one end of an NMOS 8 defining as a switch whose gate is connected to the word line $WL1_n$ and other end is connected to the bit line $BL1_m$. Also, the other electrode (hereafter called a lower electrode) is connected to one end of an NMOS 9 defining as a switch whose gate is connected to the word line $WL1_n$ and other end is connected to the plate line $PL_m$, and to one end of an NMOS 10 defining as a switch whose gate is connected to the word line $WL2_n$ and other end is connected to the bit line $BL2_m$.

When the plate line drive circuit 3 applies a write voltage Vcc to the plate line $PL_m$, and the word line drive circuit 4 applies a gate threshold voltage Vpp to the word line $WL1_n$, the NMOSs 8 and 9 whose gates are connected to the word line $WL1_n$ electrically connect the bit line $BL1_m$ that is connected to one end of the NMOSs 8 and 9 to the upper electrode of the ferroelectric capacitor $Q1_{nm}$ that is connected to the other end thereof, and electrically connect the plate line $PL_m$ to the lower electrode of the ferroelectric capacitor $Q1_{nm}$ that is connected to the other end thereof. It is noted that the write voltage Vcc is a voltage that is sufficiently greater than the coercive voltage that causes polarization reversal in the ferroelectric capacitors $Q1_{nm}$ and $Q2_{nm}$. Also, the gate threshold voltage Vpp is a voltage that is sufficiently greater than the voltage that causes the NMOS to become a conductive state.

Similarly, when the plate line drive circuit 3 applies a write voltage Vcc to the plate line $PL_m$, and the word line drive circuit 4 applies a gate threshold voltage Vpp to the word line $WL2_n$, the NMOSs 7 and 10 whose gates are connected to the word line $WL2_n$ electrically connect the bit line $BL2_m$ that is connected to one end of the NMOSs 7 and 10 to the lower electrode of the ferroelectric capacitor $Q1_{nm}$ that is connected to the other end thereof, and electrically connect the plate line $PL_m$ to the upper electrode of the ferroelectric capacitor $Q1_{nm}$ that is connected to the other end thereof.

In this manner, in accordance with the exemplary embodiment, because the plate line $PL_m$ and the ferroelectric capacitor $Q1_{nm}$ are electrically connected through the NMOSs 7 and 9, the voltage on the plate line $PL_m$ is prevented from being outputted to another ferroelectric capacitor $Q1_{nm}$ that is not subject to data reading, the wiring load of the plate line $PL_m$ can be reduced, and the writing speed and reading speed can be improved.

In a so-called one transistor one capacitor (hereafter called 1T1C) type memory cell, a potential on a plate line is outputted to other ferroelectric capacitors that are not subject to data reading. Accordingly, even when data is read from only one ferroelectric capacitor, all ferroelectric capacitors that are connected to the same plate line need re-writing. Also, the wiring load of the plate line becomes larger, and the writing speed and reading speed slow down.

Also, since each of the ferroelectric capacitors $Q1_{nm}$ and $Q2_{nm}$ composes each of the memory cells $5_{nm}$ and $6_{nm}$, the area of each of the memory cells $5_{nm}$ and $6_{nm}$ is reduced, and the chip area can be reduced. Accordingly, for example, by miniaturizing the transistor process, and integrating NMOSs 7–14 in an area for ferroelectric capacitors $Q1_{nm}$ and $Q2_{nm}$, each memory cell area can be halved, compared to a two transistors two capacitors (hereafter called a 2T2C) type memory cell that is composed of two ferroelectric capacitors.

Further, as the area of the memory cells $5_{nm}$ and $6_{nm}$ is reduced, the area of redundant memory cells is reduced, and the chip area is further reduced. It is noted that, because each memory cell in a 2T-2C type memory cell is formed with two ferroelectric capacitors, a redundant memory cell also needs to be formed with two ferroelectric capacitors, and the area of the redundant memory cell becomes larger, and the chip area further becomes larger.

Also, in the other memory cell $6_{nm}$ (the second memory cell) that is provided in the same part of the first memory cell $5_{nm}$, a ferroelectric capacitor $Q2_{nm}$ is formed at its center, two bit lines $BL3_m$ and $BL4_m$ that extend in the vertical direction from the bit line circuit 2, are arranged on the right side in the plan view of the ferroelectric capacitor $Q2_{nm}$, the plate line $PL_m$ that is shared by the adjoining first memory cell $5_{nm}$, is arranged on the left side in the plan view, and the word lines $WL1_n$ and $WL2_n$, that are shared by the adjoining first memory cell $5_{nm}$, are arranged on the upper and lower sides in the plan view.

In this manner, in accordance with the exemplary embodiment, among memory cell groups composed of the memory cells $5_{nm}$ and $6_{nm}$ that are respectively arranged in the same blocks, adjoining pairs of the memory cell groups share each plate line $PL_m$, such that the number of plate lines $PL_m$ can be reduced, the area for disposing the plate lines $PL_m$ can be reduced, and the chip area can be reduced.

It is noted that, in a 1T1C type memory cell in which each memory cell is individually provided with a plate line, the number of plate lines increases, the arrangement area of the plate line becomes larger, and thus the chip area becomes larger. Also, when there are a large number of plate lines and the wiring pitch of the plate lines is small, the operational speed of the plate lines may be lowered due to coupling capacitance of the adjoining plate lines, and data held in the memory cells may be destroyed due to increased noise transmission paths.

Also, one of electrodes (hereafter called an upper electrode) of the ferroelectric capacitor $Q2_{nm}$ is connected to one end of an NMOS 11 defining as a switch whose gate is connected to the word line $WL2_n$ and other end is connected to the plate line $PL_m$, and to one end of an NMOS 12 defining as a switch whose gate is connected to the word line $WL1_n$ and other end is connected to the bit line $BL3_m$. Also, the other electrode (hereafter called a lower electrode) is connected to one end of an NMOS 13 defining as a switch whose gate is connected to the word line $WL1_n$ and other end is connected to the plate line $PL_m$, and to one end of an NMOS 14 defining as a switch whose gate is connected to the word line $WL2_n$ and other end is connected to the bit line $BL4_m$.

When the plate line drive circuit 3 applies a write voltage Vcc to the plate line $PL_m$, and the word line drive circuit 4 applies a gate threshold voltage Vpp to the word line $WL1_n$, the NMOSs 12 and 13 whose gates are connected to the word line $WL1_n$ electrically connect the bit line $BL3_m$ that is connected to one end of the NMOSs 12 and 13 to the upper electrode of the ferroelectric capacitor $Q2_{nm}$ that is connected to the other end thereof, and electrically connect the plate line $PL_m$ to the lower electrode of the ferroelectric capacitor $Q1_{nm}$ that is connected to the other end thereof.

Similarly, when the plate line drive circuit 3 applies a write voltage Vcc to the plate line $PL_m$, and the word line drive circuit 4 applies a gate threshold voltage Vpp to the word line $WL2_n$, the NMOSs 11 and 14 whose gates are connected to the word line $WL2_n$ electrically connect the bit line $BL4_m$ that is connected to one end of the NMOSs 11 and 14 to the lower electrode of the ferroelectric capacitor $Q2_{nm}$ that is connected to the other end thereof, and electrically connect the plate line $PL_m$ to the upper electrode of the ferroelectric capacitor $Q2_{nm}$ that is connected to the other end thereof.

Next, a process of writing data in specified ferroelectric capacitors $Q1_{nm}$ and $Q2_{nm}$ will be described. First, when data "1" is to be written in specified ones of the ferroelectric capacitors $Q1_{nm}$ and $Q2_{nm}$, the potential on a word line $WL1_n$ corresponding to the specified ferroelectric capacitors $Q1_{nm}$ and $Q2_{nm}$ is initially set to the gate threshold voltage Vpp by the word line drive circuit 4. Thus, the NMOSs 8, 9, 12 and 13 whose gates are connected to the word line $WL1_n$ electrically connect the bit lines $BL1_m$ and $BL3_m$ that are connected to one ends of the NMOSs 8, 9, 12 and 13 to the upper electrodes of the specified ferroelectric capacitors $Q1_{nm}$ and $Q2_{nm}$ that are connected to the other ends thereof, and electrically connect the plate line $PL_m$ to the lower electrodes of the specified ferroelectric capacitors $Q1_{nm}$ and $Q2_{nm}$ that are connected to the other ends thereof.

Then, the potential on the bit lines $BL1_m$ and $BL3_m$ corresponding to the specified ferroelectric capacitors $Q1_{nm}$ and $Q2_{nm}$ is set to "0" by the bit line circuit 2, and the potential on other bit lines $BL1_m$ and $BL3_m$ is set to a value that is half the write voltage Vcc (hereafter called a non-selection voltage) ½ Vcc. Also, at the same time, the potential on the plate line $PL_m$ corresponding to the ferroelectric capacitors $Q1_{nm}$ and $Q2_{nm}$ is set to the write voltage Vcc by the plate line drive circuit 3, and the potential on other plate lines $PL_m$ is set to the non-selection voltage ½ Vcc. It is noted that the non-selection voltage ½ Vcc is a voltage that is sufficiently smaller than a coercive voltage that causes polarization reversal in the ferroelectric capacitors $Q1_{nm}$ and $Q2_{nm}$.

Thus, the potential on the upper electrodes of the ferroelectric capacitors $Q1_{nm}$ and $Q2_{nm}$ is set to "0," and the potential on the lower electrodes is set to the write voltage Vcc, thereby applying a negative write voltage −Vcc to the specified ferroelectric capacitors $Q1_{nm}$ and $Q2_{nm}$, and writing data "1" in the specified ferroelectric capacitors $Q1_{nm}$ and $Q2_{nm}$. In contrast, only a positive or negative non-selection voltage ½ Vcc or −½ Vcc is applied to ferroelectric capacitors $Q1_{nm}$ and $Q2_{nm}$ that are connected to the word line $WL1_n$ corresponding to the specified ferroelectric capacitors $Q1_{nm}$ and $Q2_{nm}$, to non-corresponding bit lines $BL1_m$, and to the plate line $PL_m$ corresponding to the specified ferroelectric capacitors $Q1_{nm}$ and $Q2_{nm}$, their original polarization states are maintained. Also, in other ferroelectric capacitors $Q1_{nm}$ and $Q2_{nm}$ that are connected to word lines $WL1_n$ not corresponding to the specified ferroelectric capacitors $Q1_{nm}$ and $Q2_{nm}$, the voltages applied across both electrodes thereof are the same that is "0," and therefore their original polarization state is maintained.

On the other hand, when data "0" is to be written in specified ones of the ferroelectric capacitors $Q1_{nm}$ and $Q2_{nm}$, the potential on a word line $WL1_n$ corresponding to the specified ferroelectric capacitors $Q1_{nm}$ and $Q2_{nm}$ is initially set to the gate threshold voltage Vpp by the word line drive circuit 4. Thus, the NMOSs 8, 9, 12 and 13 whose gates are connected to the word line $WL1_n$ electrically connect the bit lines $BL1_m$ and $BL3_m$ that are connected to one ends of the NMOSs 8, 9, 12 and 13 to the upper electrodes of the specified ferroelectric capacitors $Q1_{nm}$ and $Q2_{nm}$ that are connected to the other ends thereof, and electrically connect the plate line $PL_m$ to the lower electrodes of the specified ferroelectric capacitors $Q1_{nm}$ and $Q2_{nm}$ that are connected to the other ends thereof.

Then, the potential on the bit lines $BL1_m$ and $BL3_m$ corresponding to the specified ferroelectric capacitors $Q1_{nm}$ and $Q2_{nm}$ is set to the write voltage Vcc by the bit line circuit 2, and the potential on other bit lines $BL1_m$ and $BL3_m$ is set to the non-selection voltage ½ Vcc. Also, at the same time, the potential on the plate line $PL_m$ corresponding to the specified ferroelectric capacitors $Q1_{nm}$ and $Q2_{nm}$ is set to "0" by the plate line drive circuit 3, and the potential on other plate lines $PL_m$ is set to the non-selection voltage ½ Vcc.

Thus, the potential on the upper electrodes of the specified ferroelectric capacitors $Q1_{nm}$ and $Q2_{nm}$ is set to the write voltage Vcc, and the potential on the lower electrodes is set to "0," thereby applying a positive write voltage Vcc to the specified ferroelectric capacitors $Q1_{nm}$ and $Q2_{nm}$, and writing data "0" in the specified ferroelectric capacitors $Q1_{nm}$ and $Q2_{nm}$. In contrast, only a positive or negative non-selection voltage ½ Vcc or −½ Vcc is applied to ferroelectric capacitors $Q1_{nm}$ and $Q2_{nm}$ that are connected to the word line $WL1_m$ corresponding to the specified ferroelectric capacitors $Q1_{nm}$ and $Q2_{nm}$, to non-corresponding bit lines $BL1_m$, and to the plate line $PL_m$ corresponding to the specified ferroelectric capacitors $Q1_{nm}$ and $Q2_{nm}$, their original polarization states are maintained. Also, in other ferroelectric capacitors $Q1_{nm}$ and $Q2_{nm}$ that are connected to word lines $WL1_n$ not corresponding to the specified ferroelectric capacitors $Q1_{nm}$ and $Q2_{nm}$, the voltages applied across both electrodes thereof are the same that is "0," and therefore their original polarization state is maintained.

Next, a process of reading data in specified ferroelectric capacitors $Q1_{nm}$ and $Q2_{nm}$ will be described. First, when data is to be read from specified ones of the ferroelectric capacitors $Q1_{nm}$ and $Q2_{nm}$, the potential on relevant ones of the bit lines $BL1_m$ and $BL3_m$ corresponding to the specified ferroelectric capacitors $Q1_{nm}$ and $Q2_{nm}$ is initially set to the write voltage Vcc by the bit line circuit 2, and the potential on other bit lines $BL1_m$ and $BL3_m$ is set to the non-selection voltage ½ Vcc. At the same time, the potential on a relevant plate line $PL_m$ corresponding to the specified ferroelectric capacitors $Q1_{nm}$ and $Q2_{nm}$ is set to "0" by the plate line drive circuit 3, and the potential on other plate lines $PL_m$ is set to the non-selection voltage ½ Vcc.

Then, the potential of a relevant word line $WL1_n$ corresponding to the specified ferroelectric capacitors $Q1_{nm}$ and $Q2_{nm}$ can be set to the gate threshold voltage Vpp by the word line drive circuit 4. Thus, the NMOSs 8, 9, 12 and 13 whose gates are connected to the word line $WL1_n$ electrically connect the bit lines $BL1_m$ and $BL3_m$ that are connected to one ends of the NMOSs 8, 9, 12 and 13 to the upper electrodes of the specified ferroelectric capacitors $Q1_{nm}$ and $Q2_{nm}$ that are connected to the other ends thereof, and electrically connect the plate line $PL_m$ to the lower electrodes of the specified ferroelectric capacitors $Q1_{nm}$ and $Q2_{nm}$ that are connected to the other ends thereof. Thus, the potential on the upper electrodes of the specified ferroelectric capacitors $Q1_{nm}$ and $Q2_{nm}$ is set to the write voltage Vcc, and the potential on the lower electrodes is set to "0," thereby applying a positive write voltage Vcc to the specified ferroelectric capacitors $Q1_{nm}$ and $Q2_{nm}$, charging up the bit lines $BL1_m$ and $BL3_m$ by charge-transfer in the specified ferroelectric capacitors $Q1_{nm}$ and $Q2_{nm}$, and writing data "0" in the specified ferroelectric capacitors $Q1_{nm}$ and $Q2_{nm}$. It is noted here that, when data "1" is held at the specified ferroelectric capacitors $Q1_{nm}$ and $Q2_{nm}$, relatively large charge-transfer occurs due to polarization reversal, and the bit lines $BL1_m$ and $BL3_m$ are charged up with a relatively large potential VH; and when data "0" is held, relatively small charge-transfer occurs because polarization reversal does not take place, and the bit lines $BL1_m$ and $BL3_m$ are charged up with a relatively small potential VL.

Then, when the potential charged up on the bit lines $BL1_m$ and $BL3_m$ is greater than a reference potential that is set between VH and VL, the potential is amplified to the write voltage Vcc by the sense amplifier of the bit line circuit 2 that is connected to the bit lines $BL1_m$ and $BL3_m$, and when the potential is smaller than the reference potential, it is reduced to "0." In other words, when data "0" is read from the ferroelectric capacitors $Q1_{nm}$ and $Q2_{nm}$, the write voltage Vcc is outputted from the bit line circuit 2; and when data "0" is read, a potential "0" is outputted.

When data "1" is read from the ferroelectric capacitors $Q1_{nm}$ and $Q2_{nm}$, like in the normal reading operation, the potential on a word line $WL1_n$ corresponding to the specified ferroelectric capacitors $Q1_{nm}$ and $Q2_{nm}$ is initially set to the gate threshold voltage Vpp by the word line drive circuit 4. Then, the potential on bit lines $BL1_m$ and $BL3_m$ corresponding to the specified ferroelectric capacitors $Q1_{nm}$ and $Q2_{nm}$ is set to "0" by the bit line circuit 2, and the potential on other bit lines $BL1_m$ and $BL3_m$ is set to the non-selection voltage ½ Vcc. Also, at the same time, the potential on a plate line $PL_m$ corresponding to the specified ferroelectric capacitors $Q1_{nm}$ and $Q2_{nm}$ is set to the write voltage Vcc by the plate line drive circuit 3, and the potential on other plate lines $PL_m$ is set to the non-selection voltage ½ Vcc, thereby applying a negative write voltage Vcc to the specified ferroelectric capacitors $Q1_{nm}$ and $Q2_{nm}$, and writing data "1" in the specified ferroelectric capacitors $Q1_{nm}$ and $Q2_{nm}$.

Next, when inverted data is read from specified ones of the ferroelectric capacitors $Q1_{nm}$ and $Q2_{nm}$, the potential on bit lines $BL2_m$ and $BL4_m$ corresponding to the specified ferroelectric capacitors $Q1_{nm}$ and $Q2_{nm}$ is set to the write voltage Vcc by the bit line circuit 2, and the potential on other bit lines $BL2_m$ and $BL4_m$ is set to the non-selection voltage ½ Vcc. Also, at the same time, the potential on a plate line $PL_m$ corresponding to the specified ferroelectric capacitors $Q1_{nm}$ and $Q2_{nm}$ is set to "0" by the plate line drive circuit 3, and the potential on other plate lines $PL_m$ is set to the non-selection voltage ½ Vcc.

Then, the potential on a word line $WL2_n$ corresponding to the specified ferroelectric capacitors $Q1_{nm}$ and $Q2_{nm}$ is set to the gate threshold voltage Vpp by the word line drive circuit 4. Thus, the NMOSs 7, 10, 11 and 14 whose gates are connected to the word line $WL2_n$ electrically connect the bit lines $BL2_m$ and $BL4_m$ that are connected to one ends of the NMOSs 7, 10, 11 and 14 to the lower electrodes of the specified ferroelectric capacitors $Q1_{nm}$ and $Q2_{nm}$ that are connected to the other ends thereof, and electrically connect the plate line $PL_m$ to the upper electrodes of the specified ferroelectric capacitors $Q1_{nm}$ and $Q2_{nm}$ that are connected to the other ends thereof. Thus, the potential on the lower electrodes of the specified ferroelectric capacitors $Q1_{nm}$ and $Q2_{nm}$ is set to the write voltage Vcc, and the potential on the upper electrodes is set to "0," thereby applying a negative write voltage −Vcc to the specified ferroelectric capacitors $Q1_{nm}$ and $Q2_{nm}$, charging up the bit line $BL2_m$ and $BL4_m$ by charge-transfer in the specified ferroelectric capacitors $Q1_{nm}$ and $Q2_{nm}$, and writing data "1" in the specified ferroelectric capacitors $Q1_{nm}$ and $Q2_{nm}$. It is noted here that, when data "0" is held at the specified ferroelectric capacitors $Q1_{nm}$ and $Q2_{nm}$, relatively large charge-transfer occurs due to polarization reversal, and the bit lines $BL2_m$ and $BL4_m$ are charged up with a relatively large potential VH, and when data "1" is held, relatively small charge-transfer occurs because polarization reversal does not take place, and the bit lines $BL2_m$ and $BL4_m$ are charged up with a relatively small potential VL.

Then, when the potential charged up on the bit lines $BL2_m$ and $BL_m$ is greater than a reference potential that is set between VH and VL, the potential is amplified to the write voltage Vcc by the sense amplifier of the bit line circuit 2; and when the potential is smaller than the reference potential, it is reduced to "0." In other words, when data "1" is read from the ferroelectric capacitors $Q1_{nm}$ and $Q2_{nm}$, the write voltage Vcc is outputted from the bit line circuit 2; and when data "0" is read, a potential "0" is outputted.

When data "0" is read from the ferroelectric capacitors $Q1_{nm}$ and $Q2_{nm}$, like in the normal reading operation, the potential on a word line $WL2_n$ corresponding to the specified ferroelectric capacitors $Q1_{nm}$ and $Q2_{nm}$ is initially set to the gate threshold voltage Vpp by the word line drive circuit 4. Then, the potential on bit lines $BL2_m$ and $BL4_m$ corresponding to the specified ferroelectric capacitors $Q1_{nm}$ and $Q2_{nm}$ is set to "0" by the bit line circuit 2, and the potential on other bit lines $BL2_m$ and $BL4_m$ is set to the non-selection voltage ½ Vcc. Also, at the same time, the potential on a plate line $PL_m$ corresponding to the specified ferroelectric capacitors $Q1_{nm}$ and $Q2_{nm}$ is set to the write voltage Vcc by the plate line drive circuit 3, and the potential on other plate lines $PL_m$ is set to the non-selection voltage ½ Vcc, thereby applying a positive write voltage Vcc to the specified ferroelectric capacitors $Q1_{nm}$ and $Q2_{nm}$, and writing data "0" in the specified ferroelectric capacitors $Q1_{nm}$ and $Q2_{nm}$.

In this manner, in accordance with the exemplary embodiment, a state in which upper electrodes of ferroelectric capacitors $Q1_{nm}$ and $Q2_{nm}$ are electrically connected to plate lines $PL_m$ and lower electrodes thereof are electrically connected to bit lines $BL1_m$–$BL4_m$, a state in which lower electrodes of the ferroelectric capacitors $Q1_{nm}$ and $Q2_{nm}$ are electrically connected to the plate lines $PL_m$ and upper electrodes thereof are electrically connected to the bit lines, and a state in which neither upper electrodes or lower electrodes of the ferroelectric capacitors $Q1_{nm}$ and $Q2_{nm}$ are electrically connected to the plate lines $PL_m$ or to the bit lines $BL1_m$–$BL4_m$ can be selected. Consequently, when an inverted image of a monochrome image in which black sections and white sections thereof are inverted is to be displayed on a display device or the like, the plate lines $PL_m$ are connected to the electrodes of the ferroelectric capacitors $Q1_{nm}$ and $Q2_{nm}$ which have been connected to the bit lines $BL1_m$ and $BL3_m$ in holding color data in the ferroelectric capacitors $Q1_{nm}$ and $Q2_{nm}$, and the bit lines $BL2_m$ and $BL4_m$ are connected to the electrodes of the ferroelectric capacitors $Q1_{nm}$ and $Q2_{nm}$ which have been connected to the plate lines $PL_m$. Consequently, inverted data of the color data held at the ferroelectric capacitors $Q1_{nm}$ and $Q2_{nm}$ can be read out as it is, such that delay in the output timing of the inverted data can be prevented.

In a method in which an image memory is composed by arranging 1T1C type or 2T2C type memory cells in an array configuration for holding color data of a monochrome image, when an inverted image of a monochrome image in which black sections and white sections thereof are inverted is to be displayed on a display device or the like, color data read out from the ferroelectric capacitors need to be inverted by a logical circuit such as an inverter, and as a result, the output timing of the inverted image becomes delayed due to an inversion operation taking place at the logical circuit. Also, in a method in which two 1T1C type memory cells are used to obtain inverted data, or in a method in which a peripheral circuit is used to invert data read out from memory cells to obtain inverted data, the area for the memory cells and the area for the peripheral circuit becomes larger, and the chip area becomes greater.

Further, the NMOSs 8, 10, 12 and 14 electrically connect the bit lines $BL1_m$ and $BL3_m$ to the upper electrodes of the ferroelectric capacitors $Q1_{nm}$ and $Q2_{nm}$, and electrically connect the bit lines $BL2_m$ and $BL4_m$ to the lower electrodes. Accordingly, for example, among the ferroelectric capacitors $Q1_{nm}$ and $Q2_{nm}$ that can be electrically connected to the same ones of the bit lines $BL1_m$–$BL4_m$, when specified ones of the ferroelectric capacitors $Q1_{nm}$ and $Q2_{nm}$ are connected to relevant ones of the bit lines $BL1_m$–$BL4_m$, the other ferroelectric capacitors $Q1_{nm}$ and $Q2_{nm}$ may be connected to other ones of the bit lines $BL1_m$–$BL4_m$ which are different from the relevant ones of the bit lines $BL1_m$–$BL4_m$, such that those ferroelectric capacitors $Q1_{nm}$ and $Q2_{nm}$ can be simultaneously accessed.

Also, since adjoining first memory cells $5_{nm}$ and second memory cells $6_{nm}$ share each plate line $PL_m$, data can be read simultaneously from these adjoining first memory cells $5_{nm}$ and second memory cells $6_{nm}$. For example, when the image memory is serially accessed, the access speed can be increased two fold. It is noted that, in a method in which an apparent access speed is increased through providing cache memories such as serial access memories, the area for the cache memories becomes greater, and the chip area becomes greater. Also, in a method in which the memory cell capacity of each 1T1C type memory cell is doubled, the area for the memory cells becomes greater, and the chip area become greater.

In accordance with the exemplary embodiment described above, the NMOSs 7, 10, 11 and 14 in FIG. 1 define a first connection device, the NMOSs 8, 9, 12 and 13 in FIG. 1 similarly define a second connection device, the upper electrodes of the ferroelectric capacitors $Q1_{nm}$ and $Q2_{nm}$ in FIG. 1 define first electrodes, the lower electrodes of the ferroelectric capacitors $Q1_{nm}$ and $Q2_{nm}$ in FIG. 1 define second electrodes, the bit lines $BL2_m$ and $BL4_m$ in FIG. 1 define first bit lines, and the bit lines $BL1_m$ and $BL3_m$ in FIG. 1 define second bit lines.

Figure 3:
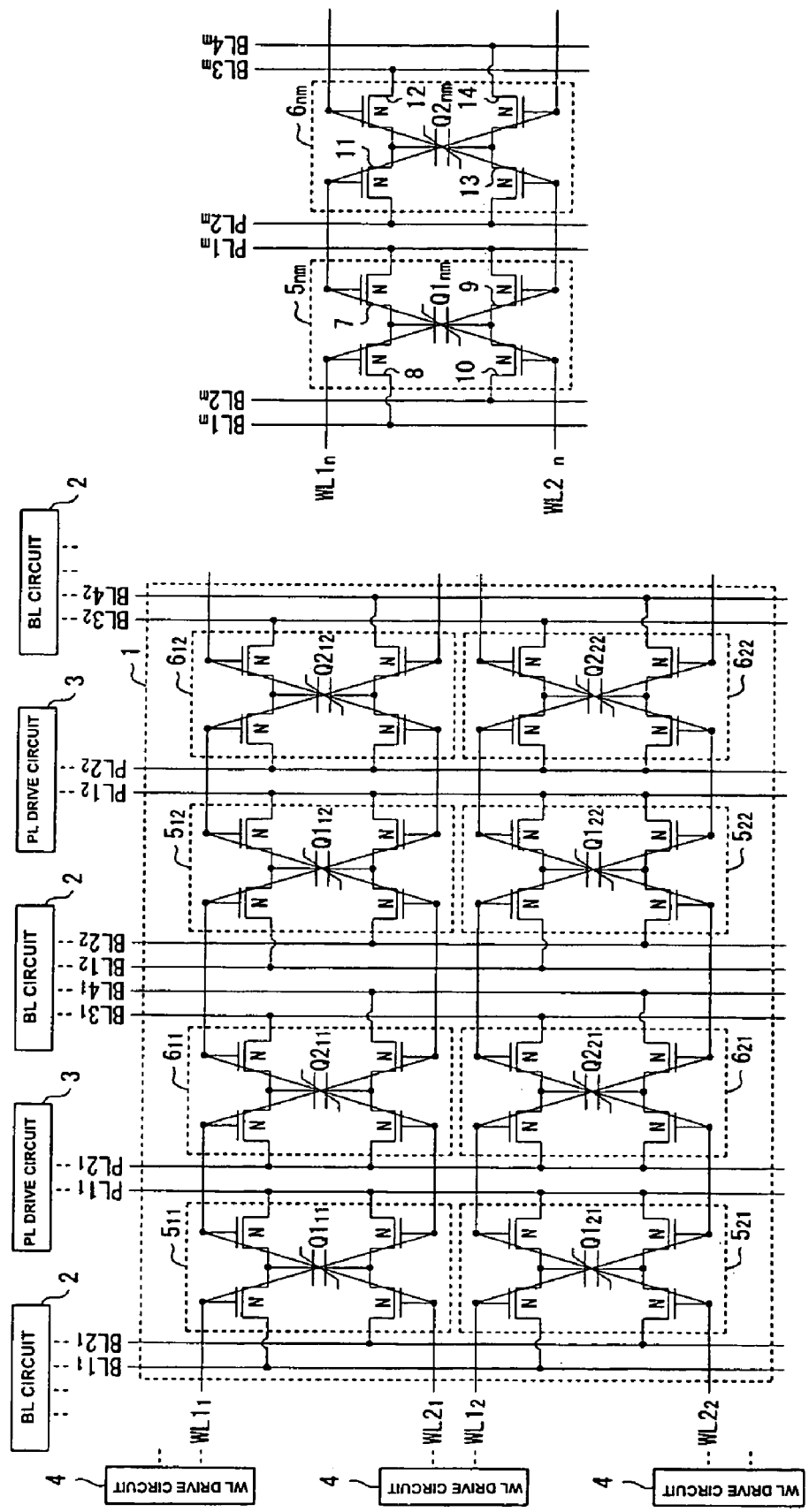
FIG. 3 shows an exemplary diagram of the structure of memory cells in accordance with a second exemplary embodiment of the invention.

Also, the exemplary embodiment described above shows one example of a memory cell in accordance with the invention, and does not limit its structure or the like. For example, in the embodiment described above, an example in which adjoining first memory cells $5_{nm}$ and second memory cells $6_{nm}$ share each plate line $PL_m$. However, without being limited to this example, for instance, among memory cell groups composed of memory cells $5_{nm}$ and $6_{nm}$ arranged in the same blocks, adjoining pairs of those of the memory cell groups may be provided independently with plate lines $PL1_m$ and $PL2_m$, respectively. More specifically, as shown in FIG. 3, two plate lines $PL1_m$ and $PL2_m$ may be extended in the vertical direction from each plate line drive circuit 3, one ends of NMOSs 7 and 9 of the first memory cell $5_{nm}$ may be connected to the plate line $PL1_m$ among them, and one ends of NMOSs 11 and 13 of the second memory cell $6_{nm}$ may be connected to the plate line $PL2_m$. By so doing, only the NMOSs 7, 9, 11 and 13 in corresponding one of the memory cells $5_{nm}$ and $6_{nm}$ among the adjoining memory cells $5_{nm}$ and $6_{nm}$ are connected to corresponding one of the plate lines $PL1_m$ $PL2_m$. Accordingly, the wiring load of the plate lines $PL1_m$ and $PL2_m$ due to junction capacitance of those NMOSs 7, 9, 11 and 13 can be reduced to about half, and the writing speed and reading speed can be improved. In this instance, adjacent plate lines $PL1_m$ and $PL2_m$ may preferably be formed in different layers over the semiconductor substrate in order to prevent an increase in coupling capacitance.

Also, there is shown above one example in which each one of the memory cells $5_{nm}$ and $6_{nm}$ is provided with two bit lines $BL1_m$ and $BL3_m$, the bit lines $BL2_m$ and $BL4_m$ are electrically connected to the lower electrodes of the ferroelectric capacitors $Q1_{nm}$ and $Q2_{nm}$ by the NMOSs 10 and 14, and the bit lines $BL1_m$ and $BL3_m$ are electrically connected to the upper electrodes of the ferroelectric capacitors $Q1_{nm}$ and $Q2_{nm}$ by the NMOSs 8 and 12. However, without being limited to this example, for example, each one of the memory cells $5_{nm}$ and $6_{nm}$ may be provided with only one bit line $BL_m$, and the bit lines $BL_m$ may be electrically connected to both of the electrodes of the ferroelectric capacitors $Q1_{nm}$ and $Q2_{nm}$ by the NMOSs 8 and 10, and 12 and 14, respectively.

Figure 4:
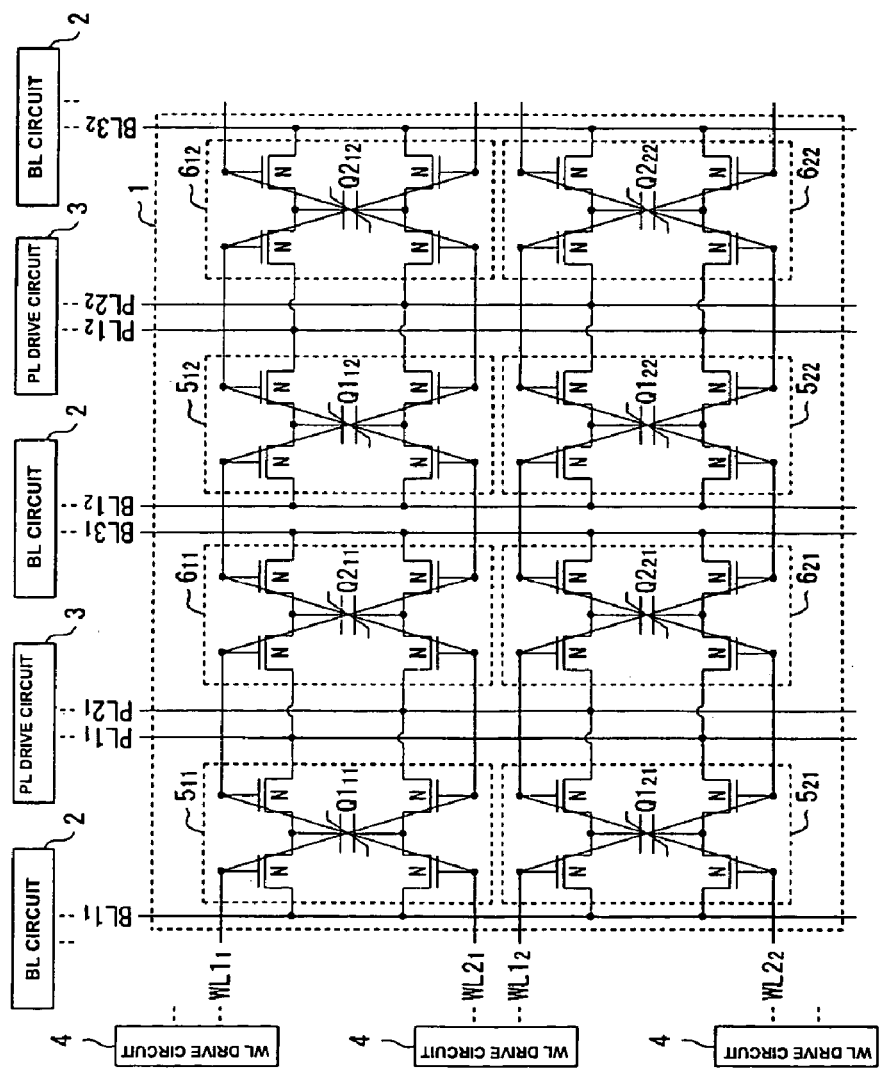
FIG. 4 shows an exemplary diagram of the structure of memory cells in accordance with a fourth embodiment of the invention.
Figure 4:
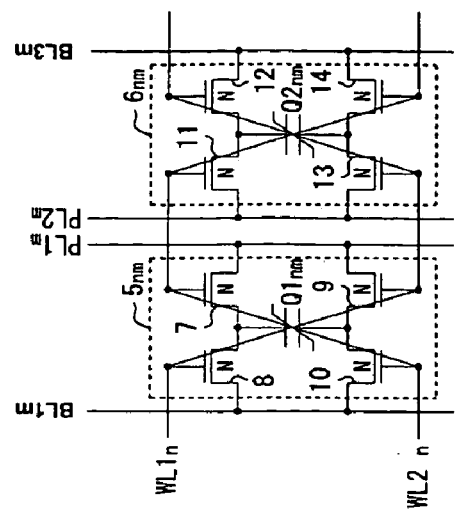

More specifically, as shown in FIG. 4, each one of bit lines $BL1_m$ and $BL3_m$ is extended in the vertical direction from each bit line drive circuit 2 for each one of the memory cells $5_{nm}$ and $6_{nm}$, respectively, one ends of NMOSs 8 and 10 of the first memory cell $5_{nm}$ may be connected to the bit line $BL1_m$, and one ends of NMOSs 12 and 14 of the second memory cell $6_{nm}$ may be connected to the bit line $BL3_m$. By so doing, peripheral circuits and the like to select bit lines $BL_m$ are not needed, and the chip area can be reduced.

Furthermore, there is shown above one example in which, when data are read from the ferroelectric capacitors $Q1_{nm}$ and $Q2_{nm}$, the bit lines $BL1_m$ and $BL3_m$ are always connected to the upper electrodes, and the plate lines $PL_m$ are always connected to the lower electrodes. However, without being limited to this example, for instance, the BL circuits 2, the PL drive circuits 3 and the WL drive circuits 4 may be controlled such that, at each reading operation, a first state in which the plate lines $PL_m$ are connected to the upper electrodes and the bit lines $BL1_m$ and $BL3_m$ are connected to the lower electrodes, and a second state in which the bit lines $BL1_m$ and $BL3_m$ are connected to the upper electrodes and the plate lines $PL_m$ are connected to the lower electrodes can be alternately selected. By so doing, for instance, when data read out from the ferroelectric capacitors $Q1_{nm}$ and $Q2_{nm}$ are to be re-written, polarization reversal can always take place in the ferroelectric capacitors $Q1_{nm}$ and $Q2_{nm}$, such that characteristic deterioration due to the polarization reversal can be generally equalized across the entire ferroelectric capacitors $Q1_{nm}$ and $Q2_{nm}$.

It is noted that, according to the method in which, upon reading data from the ferroelectric capacitors $Q1_{nm}$ and $Q2_{nm}$, the bit lines $BL1_m$ and $BL3_m$ are always connected to the upper electrodes, and the plate lines $PL_m$ are always connected to the lower electrodes, polarization reversal does not take place in those of the ferroelectric capacitors $Q1_{nm}$ and $Q2_{nm}$ from which data "0" is read, when data read from the ferroelectric capacitors $Q1_{nm}$ and $Q2_{nm}$ are re-written, characteristic deterioration due to polarization reversal would vary in the ferroelectric capacitors $Q1_{nm}$ and $Q2_{nm}$, and variations occur in potentials VH and VH that are charged up on the bit lines $BL1_m$ and $BL3_m$. Accordingly, a large reading margin needs to be set when the sense amplifier performs reading.

Also, the embodiment described above shows one example in which memory cells in accordance with the invention are arranged in an array configuration to compose an image memory for holding color data of monochrome images. However, without being limited to this example, for instance, a memory for an apparatus that performs addition, subtraction, etc. of binary numbers can be composed. By so doing, inverted data, in other words, a complement of one can be readily obtained, and thus subtraction of binary numbers can be readily conducted.

It is noted that, according to a method in which a complement of one is obtained by using two 1T1C type memory cells, or a method in which a complement of one is obtained by inverting data read out from a 1T1C type memory cell by a peripheral circuit, the area for memory cells or the area for the peripheral circuit becomes larger, and the chip area becomes larger.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A memory cell, comprising:
   a ferroelectric capacitor;
   a first connection device that is capable of realizing a first state in which a first electrode of the ferroelectric capacitor is electrically coupled to a plate line and a second electrode of the ferroelectric capacitor is electrically coupled to a bit line; and
   a second connection device that is capable of realizing a second state in which the second electrode of the ferroelectric capacitor is electrically coupled to the plate line and the first electrode of the ferroelectric capacitor is electrically coupled to the bit line,
   the first state, the second state, or a state in which the first electrode and the second electrode are not coupled to either the plate line or the bit line can be selected.

2. The memory cell according to claim 1, the first connection device electrically coupling a first bit line to the second electrode of the ferroelectric capacitor, and the second connection device electrically coupling a second bit line different from the first bit line to the first electrode of the ferroelectric capacitor.

3. The memory cell according to claim 1, the first connection device electrically coupling a specified bit line to the second electrode of the ferroelectric capacitor, and the second connection device electrically coupling the specified bit line to the first electrode of the ferroelectric capacitor.

4. The memory cell according to claim 1, comprising a selection device that alternately selects the first state and the second state at each reading when repeatedly reading identical data from an identical ferroelectric capacitor.

5. A semiconductor memory device, comprising a plurality of the memory cells according to claim 1 composed in an array configuration.

6. The semiconductor memory device according to claim 5, among memory cell groups composed of the plurality of the memory cells that are arranged in the same row, pairs of adjoining ones of the memory cell groups commonly sharing a plate line.

7. The semiconductor memory device according to claim 5, among memory cell groups composed of the plurality of the memory cells that are arranged in the same row, pairs of adjoining ones of the memory cell groups being individually provided with plate lines, respectively.

* * * * *